United States Patent [19]

Jensen et al.

[11] Patent Number: 4,609,586
[45] Date of Patent: Sep. 2, 1986

[54] THERMALLY CONDUCTIVE PRINTED WIRING BOARD LAMINATE

[75] Inventors: Warren M. Jensen, Kirkland; William C. Wilkinson, Redmond, both of Wash.

[73] Assignee: The Boeing Company, Seattle, Wash.

[21] Appl. No.: 637,111

[22] Filed: Aug. 2, 1984

[51] Int. Cl.⁴ .......................... H05K 1/04; B05D 5/12
[52] U.S. Cl. .................................... 428/209; 428/901; 428/408; 428/418; 428/245
[58] Field of Search ............... 428/901, 209, 408, 418, 428/458, 245, 246

[56] References Cited

U.S. PATENT DOCUMENTS

| | | |
|---|---|---|
| Re. 29,784 | 9/1978 | Chadwick et al. |
| 3,107,197 | 10/1963 | Stein et al. |
| 3,136,680 | 6/1964 | Hochberg |
| 3,166,688 | 1/1965 | Rowand et al. |
| 3,168,426 | 2/1965 | Blackie |
| 3,217,083 | 11/1965 | Gore |
| 3,398,233 | 8/1968 | Lizasoain et al. |
| 3,421,972 | 1/1969 | Cromwell et al. |
| 3,486,961 | 12/1969 | Adams |
| 3,700,538 | 10/1972 | Kennedy |
| 3,770,488 | 11/1973 | Pepper et al. |
| 3,864,160 | 2/1975 | Davidoff |
| 3,894,863 | 7/1975 | Lachman et al. |
| 3,934,334 | 1/1976 | Hanni |
| 3,972,755 | 8/1976 | Misfeldt |
| 3,972,765 | 8/1976 | Kondo et al. ................ 428/901 X |
| 4,018,962 | 4/1977 | Pedlow |
| 4,035,694 | 7/1977 | Barton et al. |
| 4,103,102 | 7/1978 | Klein |
| 4,132,828 | 1/1979 | Nakamura et al. |
| 4,157,409 | 6/1979 | Levitt et al. |
| 4,169,911 | 10/1979 | Yoshida et al. |
| 4,254,172 | 3/1981 | Takahashi et al. |
| 4,303,715 | 12/1981 | Chang |
| 4,318,954 | 3/1982 | Jensen |
| 4,335,180 | 6/1982 | Traut |
| 4,410,585 | 10/1983 | McLoughlin ............... 428/283 X |
| 4,507,341 | 3/1985 | Heseltine .................... 428/408 X |

FOREIGN PATENT DOCUMENTS 562869 10/1975 U.S.S.R.
864605 6/1979 U.S.S.R.

OTHER PUBLICATIONS

"Using Hermetic Chip Carriers in Military Applications, Part 1: Some Useful Modules", P. F. McKittrick, Circuits Manufacturing, May 1984, pp. 48–54.

"Kevlar ® Epoxy for Chip Carrier MLBs", Rodman A. Mogle & Douglas J. Sober, pp. 1–9.

"Section 2 Task I–Materials Development", Lockheed Missiles & Space Co., Inc., LMSC-D758140, pp. 2-1 thru 3-42.

"Kevlar ® Epoxy Substrate for Interconnecting Leadless Chip Carrier", Packard, 15th National SAMPE Technical Conference, Oct. 4–6, 1983, pp. 636–645.

Primary Examiner—Nancy A. B. Swisher
Attorney, Agent, or Firm—Christensen, O'Connor, Johnson & Kindness

[57] ABSTRACT

A printed wiring board laminate is disclosed that is particularly suitable for use with leadless surface mounted devices such as ceramic chip carries. The laminate combines a low coefficient of thermal expansion in the X-Y direction with thermal conductivity. In one embodiment, the laminate comprises a support fabricated from graphite fiber reinforced metal adhesively secured to a printed wiring board fabricated from dielectric (e.g., glass) fiber reinforced resin. The support has an X-Y coefficient of thermal expansion less than about 4 ppm/°C., and the printed wiring board has a coefficient of thermal expansion greater than about 10 ppm/°C. In a second embodiment, the support comprises a core of graphite fiber reinforced metal or resin sandwiched between two metal sheets.

11 Claims, 5 Drawing Figures

THERMALLY CONDUCTIVE PRINTED WIRING BOARD LAMINATE

FIELD OF THE INVENTION

The present invention relates to printed wiring boards, and in particular to printed wiring board laminates having low coefficients of thermal expansion and high thermal conductivities. Such printed wiring board laminates are particularly useful for mounting and interconnecting ceramic chip carriers.

BACKGROUND OF THE INVENTION

Printed wiring boards are well known in the electronics industry. Such boards typically consist of a thermosetting resin matrix reinforced with a fibrous material. The fibrous reinforcing material is normally glass, although other dielectric reinforcing materials such as paper, quartz and aramid have also been used. The printed wiring board is completed by the creation of appropriate patterns of electrically conductive material on one or both surfaces of the board.

Two important characteristics of a printed wiring board are its coefficient of thermal expansion and its thermal conductivity. Differences in the coefficient of thermal expansion between a printed wiring board and the components, solder and plating on the board can result in solder joint cracking and failure when the assembly is subjected to temperature variations. If components such as ceramic chip carriers are to be mounted to the board, it is important to match the coefficient of thermal expansion in the plane of the board (X-Y direction) to the coefficient of thermal expansion of the ceramic chip carriers, while retaining a coefficient of thermal expansion in the thickness (Z) direction approximating that of solder, plating and component leads.

The coefficient of thermal expansion of a conventional glass fiber reinforced epoxy printed wiring board is approximately 14–17 parts per million/degree Celsius (ppm/°C.). This value is considered acceptable for attachment of axial leaded, radial leaded, DIP and flat-pack components to the board. Ceramic chip carriers, however, have coefficient of thermal expansion of 4.8 to 6.5 ppm/°C. One known technique of lowering the X-Y coefficient of thermal expansion of glass epoxy boards has been to employ laminates, such as those disclosed in U.S. Pat. No. 4,318,954. In the laminates disclosed in that patent, the printed wiring board has a support composed of graphite fiber reinforced resin. Because graphite fibers have a negative coefficient of thermal expansion, the X-Y coefficient of thermal expansion of the support can be made very small (less than 3.6 ppm/°C.), resulting in an apparent X-Y coefficient of thermal expansion of the resultant printed wiring board approximating that of a ceramic chip carrier.

As mentioned above, a second important characteristic of a printed wiring board is the board's thermal conductivity. In many applications, convective air cooling of electronic components is not possible or practical, and alternative methods of conveying heat away from electronic components are required. It would therefore be desirable to produce a printed wiring board having a thermal conductivity high enough to transfer large heat loads. The high thermal conductivity of the board, however, would have to be achieved without sacrificing other important properties, such as an appropriate coefficient of thermal expansion. To date, no glass-epoxy based printed wiring boards have been available that combine high thermal conductivity with a low coefficient of thermal expansion.

SUMMARY OF THE INVENTION

The present invention provides a printed wiring board laminate that is particularly suitable for use with ceramic chip carriers. The printed wiring board laminate combines a low coefficient of thermal expansion in the X-Y direction with a high thermal conductivity to facilitate cooling of the board and of components attached thereto.

In a preferred embodiment, the printed wiring board laminate of the present invention includes a support comprising a metal matrix reinforced by graphite fiber, and a printed wiring board comprising dielectric (e.g. glass) fiber reinforced resin. The support has an X-Y coefficient of thermal expansion of less than about 4 ppm/°C., and the printed wiring board has a coefficient of thermal expansion greater than about 10 ppm/°C. The printed wiring board is secured to the support by means of an adhesive. The apparent coefficient of thermal expansion of the laminate in the X-Y direction approximates the coefficient of thermal expansion of a ceramic chip carrier, and heat generated by components attached to the printed wiring board may be efficiently conducted away by the support.

In a second embodiment, the printed wiring board laminate of the present invention comprises a dielectric fiber reinforced resin printed wiring board having a coefficient of thermal expansion greater than about 10 ppm/°C., secured by adhesive to a support comprising a graphite fiber reinforced resin or metal core positioned between two metal sheets. The core has an X-Y coefficient of thermal expansion less than about 4 ppm/°C.

DETAILED DESCRIPTION OF THE INVENTION

Figure 1:
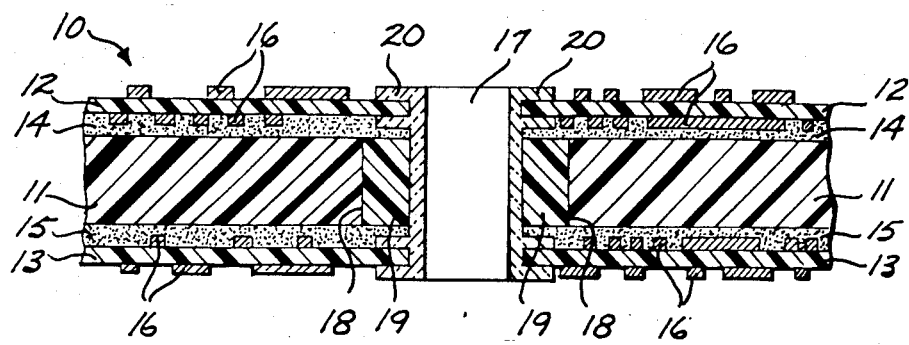
FIG. 1 is a fragmentary cross-sectional view of a preferred embodiment of the printed wiring board laminate of the present invention.

Referring initially to FIG. 1, one preferred embodiment of the present invention is illustrated comprising printed wiring board laminate 10. Laminate 10 comprises support member 11 and printed wiring boards 12 and 13 secured to opposite sides of support member 11 by adhesive layers 14 and 15, respectively. Each printed wiring board 12 and 13 is provided with electrical conducting strips 16 on its upper and lower surfaces.

Printed wiring boards 12 and 13 are fabricated from wiring board material consisting of an inner layer of dielectric fiber reinforced resin sandwiched between metal (usually copper) sheets. The printed wiring boards are fabricated by cutting such material if necessary to an appropriate size, and by etching the copper layers to produce strips in the required pattern. The resin of printed wiring boards 12 and 13 is generally a thermosetting resin, although thermoplastic resins such as polytetrafluoroethylene may be used. Commonly used thermosetting resins include epoxy resins, unsaturated polyester resins and polyimide resins. The fibrous dielectric reinforcing material of printed wiring boards 12 and 13 is usually glass. Although specialized fibers are available for reinforcing printed wiring boards so as to reduce the coefficient of thermal expansion of the boards to values in the range of ceramic chip carriers, the present invention is directed to those applications wherein it is desired, for cost, availability or other reasons, to use glass/epoxy boards or their equivalents. These boards have coefficients of thermal expansion greater than 10 ppm/°C. The laminates of the present invention achieve the required reduction in the coefficient of thermal expansion by securing the printed wiring boards to an appropriate support member.

Support member 11 is composed of a metal matrix reinforced by graphite fibers, the graphite fibers preferably comprising 40%-60% by volume of the support member. The quantity of graphite fibers in support member 11 is controlled such that the support member has a coefficient of thermal expansion in the plane of the support member (X-Y direction) less than 4 ppm/°C. The metal of support member 11 may be selected based upon thermal conductivity, weight, cost and other factors. Preferred metals are aluminum, magnesium and copper.

Adhesive layers 14 and 15 comprise a nonconducting, thermosetting adhesive. A suitable material for adhesive layers 14 and 15 consists of prepreg sheets of glass fiber fabric impregnated with epoxy or polyimide resin. The prepreg sheets are sandwiched between support member 11 and the respective printed wiring boards, and then compressed and heated to cure the resin.

Because support member 11 is electrically conductive, it is necessary to insulate the support member from conducting strips 16 and from transverse structures such as plated through hole 17. Plated through hole 17 consists of a copper plated lining 20 that provides electrical connection when needed between common electrical conducting strips 16 on different surfaces of the printed wiring boards. Insulation of the support member from conducting strips 16 is accomplished by nonconducting adhesive layers 14 and 15. Insulation of support member 11 from plated through hole 17 is accomplished by drilling an oversized hole 18 in support member 11, and by filling the perimeter of hole 18 with an electrically nonconductive material, such as a mineral/glass filled epoxy 19, that has a low coefficient of thermal expansion.

Printed wiring board laminates having X-Y coefficients of thermal expansion in the range of 6-7.5 ppm/°C. have been generally found to be the most suitable for mounting of ceramic chip carriers. As described in the examples below, printed wiring board laminates can be constructed as shown in FIG. 1 that have X-Y coefficients of thermal expansion in such a range and that have thermal conductivities significantly higher than that of glass/epoxy boards and of laminates having lower modulus graphite/epoxy cores. By way of example, thermal conductivities in excess of 175 W/m/°C. (watts per meter per degree Celsius), and as high as 200-300 W/m/°C., can be achieved by laminates of the present invention.

Figure 2:
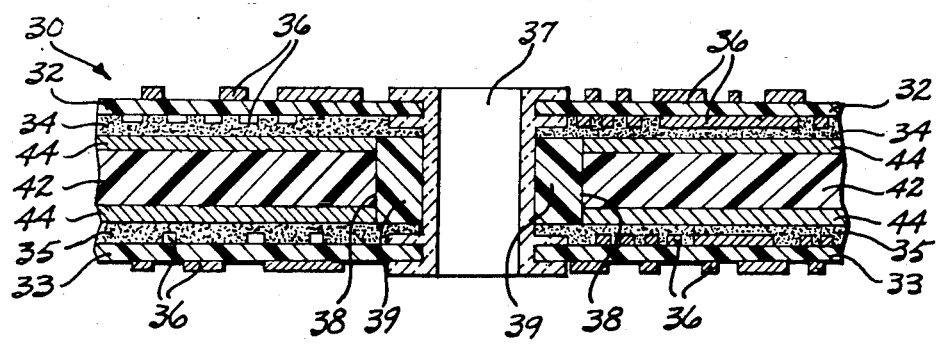
FIG. 2 is a fragmentary cross-sectional view of a second preferred embodiment of the printed wiring board laminate of the present invention.

FIG. 2 illustrates printed wiring board laminate 30 according to a second preferred embodiment of the present invention. Laminate 30 comprises printed wiring boards 32 and 33 secured to opposite sides of a support member by nonconductive adhesive layers 34 and 35, respectively. In the embodiment of FIG. 2, the support member comprises core 42 sandwiched between metal sheets 44. Each printed wiring board 32 and 33 is provided with electrical conducting strips 36 on its upper and lower surfaces.

As in the embodiment of FIG. 1, printed wiring boards 30 and 32 are fabricated from a dielectric fiber reinforced resin, and have coefficients of thermal expansion greater than 10 ppm/°C. Core 42 comprises a resin or metal matrix reinforced with graphite fibers. Metal sheets 44 are preferably composed of copper. The compositions and dimensions of core 42 and metal sheets 44 are controlled such that the support comprising core 42 and metal sheets 44 has a coefficient of thermal expansion in the X-Y direction less than 4 ppm/°C. The embodiment of FIG. 2 also includes plated through hole 37 that is insulated from core 42 and from metal sheets 44 by nonconductive material 39 positioned in oversized hole 38. In the embodiment of FIG. 2, a high thermal conductivity is achieved principally by means of metal sheets 44, and a suitable coefficient of thermal expansion is achieved by means of core 42. The relative thickness of sheets 44 must of course be limited so as to avoid producing a support having a coefficient of thermal expansion that is too high.

Figure 3:
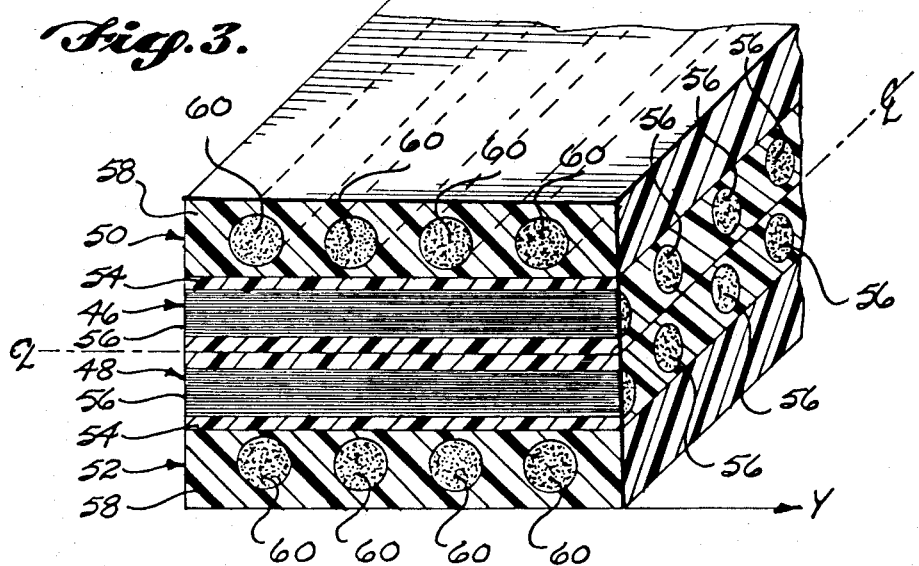
FIG. 3 is a schematic, perspective view of a cross-plied support for use in the embodiment of FIG. 1.

FIG. 3 illustrates one preferred cross-plied construction for support member 11 of the laminate of FIG. 1. The support member shown in FIG. 3 comprises bonded together inner layers 46 and 48 and outer layer 50 and 52. Each inner layer 46 and 48 comprises a metal matrix 54 through which bundles 56 of graphite fibers extend in the Y direction. Similarly, each outer layer 50 and 52 comprises metal matrix 58 through which bundles 60 of graphite fibers extend in the X direction. Since bundles 56 and 60 both comprise graphite fibers, these bundles have negative coefficients of thermal expansion along the longitudinal axes of the respective bundles. Bundles 56 therefore cause inner layers 46 and 48 to have a low coefficient of thermal expansion along the Y direction, and bundles 60 cause outer layers 50 and 52 to have a low coefficient of thermal expansion along the X direction. As a result, support member 11 as a whole has a low coefficient of thermal expansion in both the X and Y directions. Other known cross-plied constructions may also be used, including for example a construction in which the graphite fiber bundles in adjacent layers are rotated at angles other than 0° and 90°, e.g., at angles of 60°, with respect to one another. To avoid warpage, such cross-plied constructions should be symmetric about their center planes.

Figure 4:
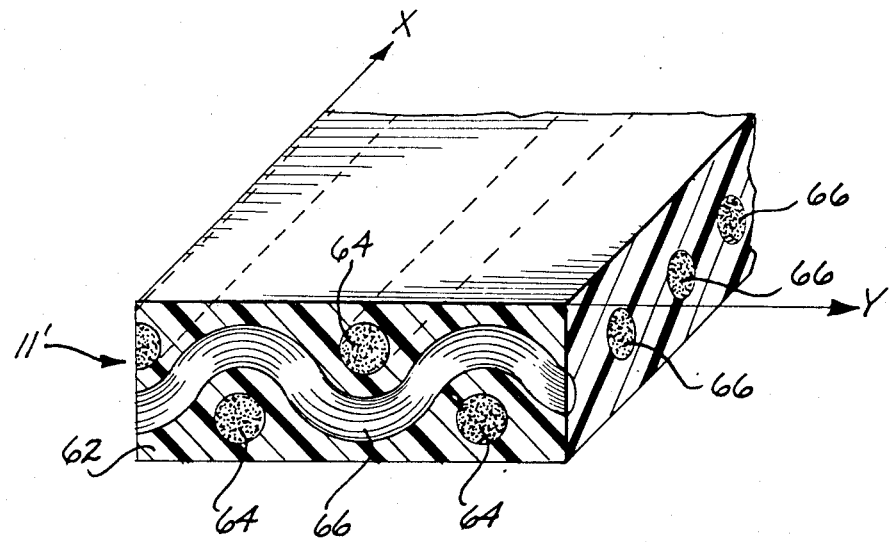
FIG. 4 is a schematic, perspective view of a woven fabric support for use in the embodiment of FIG. 1.

FIG. 4 illustrates a second preferred embodiment for the support member, designated 11', of the laminate of FIG. 1. The embodiment of FIG. 4 comprises metal matrix 62 through which interwoven graphite fiber bundles 64 and 66 extend. Bundles 64 are substantially aligned along the X direction, while bundles 66 are substantially aligned along the Y direction. The embodiment shown in FIG. 4 therefore produces a result similar to the embodiment of FIG. 3, i.e., a low coefficient of thermal expansion in both the X and Y directions.

Figure 5:
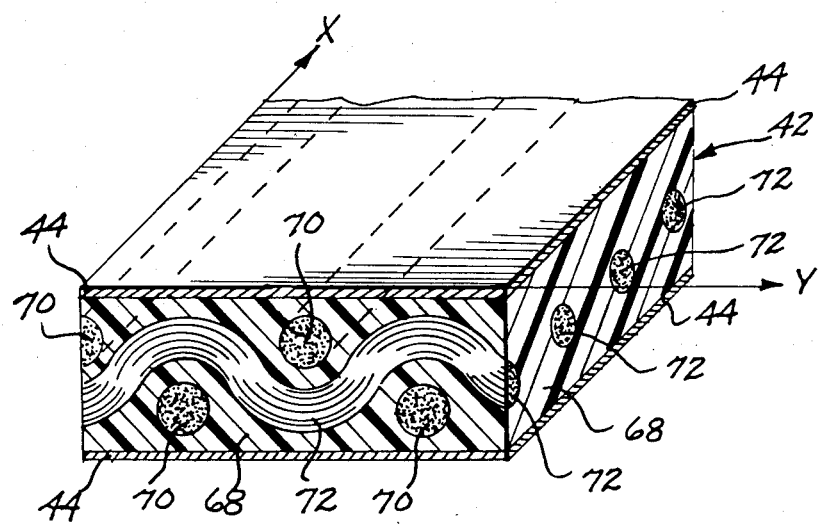
FIG. 5 is a schematic, perspective view of a cross-plied support for use in the embodiment of FIG. 2.

FIG. 5 illustrates one preferred embodiment for the support member of the laminate of FIG. 2. As previously described, this support member comprises core 42 sandwiched between metal sheets 44. Core 42 comprises matrix 68 through which interwoven bundles 70 and 72 of graphite fibers extend. Bundles 70 are substantially aligned along the X direction, while bundles 72 are substantially aligned along the Y direction. The embodiment shown in FIG. 5 therefore produces a result similar to the embodiments of FIGS. 3 and 4, i.e., a low coefficient of thermal expansion in both the X and Y directions. Matrix 68 may comprise either a resin or a metal.

EXAMPLE 1

The coefficient of thermal expansion $\alpha_S$ of a support member composed of graphite reinforced aluminum may be determined from the equation:

$$\alpha_S = [(\alpha_1 E_1 X_1 + \alpha_2 E_2 X_2)/(E_1 X_1 + E_2 X_2)] \qquad (1)$$

wherein $\alpha$ is the coefficient of thermal expansion, E is the modulus of elasticity, X is the volume fraction, and where subscripts 1 and 2 refer to the graphite and aluminum respectively. For a high modulus graphite having a modulus of elasticity of 100 million pounds per square inch (msi), $\alpha_1 = -1.6$ ppm/°C. and $E_1 = 100$ msi. For a typical aluminum component, $\alpha_2 = 22$ ppm/°C. and $E_2 = 10$ msi. For a support member composed of equal volume parts of graphite and aluminum, $\alpha_S$ will then be equal to 2.3 ppm/°C. In equation (1), it must be borne in mind that the volume fraction of graphite, $X_1$, must be halved to account for the fact that only half of the graphite fibers extend in a given direction (X or Y).

The upper limit for the volume fraction of graphite in a graphite/aluminum support is limited by the manufacturing methods used for producing such composites, and by the decreasing mechanical strength of the support member when the graphite content is increased. In general, graphite/aluminum sheets are commercially available having graphite contents as high as 60%, and sheets having graphite contents up to 60% are suitable for the purpose of the present invention. If a volume fraction of 60% graphite is substituted into equation (1) above, then the resulting $\alpha_S$ value will be 1.1 ppm/°C.

The lower limit for the graphite content of the support member of the present invention is governed by the requirement that the support member have a sufficient low coefficient of thermal expansion, i.e., a coefficient of thermal expansion less than about 4.0 ppm/°C. For the example given above, a graphite volume fraction of 0.4 yields a value for $\alpha_S$ of 3.8 ppm/°C.

EXAMPLE 2

The coefficient of thermal expansion of the laminates of the present invention may be determined by calculating the coefficients of thermal expansion and the moduli of the support member and the printed wiring board. For the support member described in Example 1 above with a graphite volume fraction of 0.5, $\alpha_S$ has a value of 2.3 ppm/°C. The modulus of the resulting support member, $E_S$, may be calculated based upon the equation:

$$E_S = E_1 X_1 + E_2 X_2 = 30 \text{ msi} \qquad (2)$$

The coefficient of thermal expansion, $\alpha_T$, of the support member combined with a wiring board may then be found by an equation similar to equation (1):

$$\alpha_T = [(\alpha_S E_S X_S + \alpha_B E_B X_B)/(E_S X_S + E_B X_B)] \qquad (3)$$

where the subscripts S and B refer to the support and the wiring board, respectively. Typical values for a glass/epoxy printed wiring board are $\alpha_B = 15$ ppm/°C. and $E_B = 2.5$ msi. Therefore, for a laminate in which $X_S = 0.15$ and $X_B = 0.85$, $\alpha_T$ will have a value of 6.4 ppm/°C., a value suitable for mounting ceramic chip carriers.

EXAMPLE 3

The thermal conductivity, $K_S$, of the support member described in Examples 1 and 2 may be determined from the relationship:

$$K_S = K_1 X_1 + K_2 X_2 \qquad (4)$$

where K represents thermal conductivity, X represents volume fraction, and where the subscripts 1 and 2 stand for the graphite and aluminum components respectively. For a high modulus (100 msi) graphite, $K_1 = 525$ W/m/°C. (watts per meter per °C.), and for a typical aluminum component $K_2 = 150$ W/m/°C. Therefore, for a support composed of equal parts of graphite and aluminum, $K_S$ will have a value of 206 W/m/°C. In performing this calculation, the graphite volume fraction $X_1$ is halved so that the resulting $K_S$ value represents the thermal conductivity in either the X or Y direction. A comparable support composed of high modulus graphite and an epoxy matrix would have a thermal conductivity of about 175 W/m/°C. or less, while a typical value for the thermal conductivity for a glass/epoxy printed wiring board is 0.3 W/m/°C. It is therefore apparent that laminates according to the present invention represent a significant improvement over previously available printed wiring boards.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. A printed wiring board laminate adapted for use with a ceramic chip carrier, the printed wiring board laminate comprising:
   an electrically conductive support comprising a metal matrix reinforced by graphite fiber, the support having a coefficient of thermal expansion parallel to the surface of the laminate of less than about 4 parts per million/°C.; and
   a printed wiring board comprising dielectric fiber reinforced resin, the printed wiring board being secured to the support by means of an adhesive and having a coefficient of thermal expansion greater than about 10 parts per million/°C.;
   whereby the apparent coefficient of thermal expansion of the laminate parallel to the surface of the laminate approximates the coefficient of thermal expansion of a ceramic chip carrier, and whereby heat generated by components mounted to the printed wiring board may be conducted away by the support.

2. The laminate of claim 1, wherein the metal is selected from the group consisting of aluminum, magnesium and copper.

3. The laminate of claim 1, wherein the metal is aluminum.

4. The laminate of claim 1, wherein the support consists of 40%–60% by volume graphite fiber.

5. The laminate of claim 1, wherein the graphite fiber comprises a first set of graphite fibers extending in a first direction parallel to the surface of the laminate, and a second set of graphite fibers extending in a second direction parallel to the surface of the laminate and inclined with respect to the first direction.

6. A printed wiring board laminate adapted for use with a ceramic chip carrier, the printed wiring board laminate comprising:

an electrically conductive support comprising a core positioned between two metal sheets, the core comprising a matrix reinforced by graphite fiber, the support having a coefficient of thermal expansion parallel to the surface of the laminate of less than about 4 parts per million/°C.; and a printed wiring board comprising dielectric fiber reinforced resin, the printed wiring board being secured to the support by means of an adhesive and having a coefficient of thermal expansion greater than about 10 parts per million/°C.;

whereby the apparent coefficient of thermal expansion of the laminate parallel to the surface of the laminate approximates the coefficient of thermal expansion of a ceramic chip carrier, and whereby heat generated by components mounted to the printed wiring board may be conducted away by the support.

7. The laminate of claim 6, wherein the matrix comprises a resin.

8. The laminate of claim 6, wherein the matrix comprises a metal.

9. The laminate of claim 6, wherein the metal sheets comprise copper sheets.

10. The laminate of claim 6, wherein the core consists of 40%–60% by volume graphite fiber.

11. The laminate of claim 6, wherein the graphite fiber comprises a first set of graphite fibers extending in a first direction parallel to the surface of the laminate, and a second set of graphite fibers extending in a second direction parallel to the surface of the laminate and inclined with respect to the first direction.

* * * * *

UNITED STATES PATENT AND TRADEMARK OFFICE
CERTIFICATE OF CORRECTION

PATENT NO. : 4,609,586

DATED : September 2, 1986

INVENTOR(S) : Jensen et al.

It is certified that error appears in the above-identified patent and that said Letters Patent is hereby corrected as shown below:

Abstract, line 6, insert --a high-- before "thermal"

Column 4, line 32, "layer" should be --layers--

Signed and Sealed this

Fourth Day of November, 1986

[SEAL]

*Attest:*

DONALD J. QUIGG

*Attesting Officer*  *Commissioner of Patents and Trademarks*